United States Patent [19]
Steckner

[11] Patent Number: 5,865,747
[45] Date of Patent: Feb. 2, 1999

[54] METHOD FOR REDUCING FAST SPIN ECHO MOTION ARTIFACTS BY ECHO SELECTION

[75] Inventor: C. Michael Steckner, Mayfield Hts., Ohio

[73] Assignee: Picker International, Inc., Highland Heights, Ohio

[21] Appl. No.: 837,704

[22] Filed: Apr. 22, 1997

Related U.S. Application Data

[60] Provisional application No. 60/017,355 Apr. 26, 1996.

[51] Int. Cl.$^6$ .................................................. A61B 5/055
[52] U.S. Cl. ........................... 600/413; 324/307; 324/309
[58] Field of Search ................................... 600/410, 413; 324/307, 309

[56] References Cited

U.S. PATENT DOCUMENTS

| | | |
|---|---|---|
| 4,728,890 | 3/1988 | Pattany et al. |
| 5,431,163 | 7/1995 | Kajima . |

OTHER PUBLICATIONS

Pradip M. Pattany, et al., *Motion Artifact Suppression Technique (MAST) for MR Imaging*, Journal of Computer Assisted Tomography, 11(3) :369–377, May/Jun.

R. Scott Hinks, et al., *Gradient Moment Nulling in Fast Spin Echo*, MRM 32(6) 698–706 (1994).

A.M. Siuciak, et al., *Eddy Currents Effects on the Fast Spin Echo Sequence*, 1994 SMR Conference, p. 476.

G.L. Nayler, *Blood Flow Imaging By Cine Magnetic Resonance*, Journal of Computer Assisted Tomography, 10(5):715–722, Sep./Oct.

*Primary Examiner*—Marvin M. Lateef
*Assistant Examiner*—Eleni Mantis Mercader
*Attorney, Agent, or Firm*—Fay, Sharpe, Beall, Fagan, Minnich & McKee

[57] ABSTRACT

After exciting dipoles in an examination region (60), a train of magnetic resonance echoes including echoes ($66_1$, $66_2$, ...) is induced, e.g., with a series of refocusing pulses including pulses ($68_1$, $68_2$, ...). The echoes are phase and frequency-encoded. A receiver 38 is gated by a gate circuit (82) to sample the even echoes ($66_2$–$66_{10}$) and the odd echoes ($66_5$–$66_{10}$) that occur after a threshold odd echo such as the third echo ($66_3$) so as to generate an image of a common physical region which exhibits reduced motion artifacts.

8 Claims, 2 Drawing Sheets

METHOD FOR REDUCING FAST SPIN ECHO MOTION ARTIFACTS BY ECHO SELECTION

This application claims benefit of provisional application Ser. No. 60/017,355 filed Apr. 26, 1996.

BACKGROUND OF THE INVENTION

The present invention relates to the magnetic resonance imaging arts. It finds particular application in conjunction with reducing fast spin echo (FSE) motion artifacts and will be described with particular reference thereto. However, it should be appreciated that the present invention may also find application in conjunction with other imaging applications which compensate for motion artifacts.

Motion artifact suppression techniques (MAST) are used to reduce ghosting artifacts produced by body motion and fluid flow. Motion artifact suppression techniques based on gradient moment nulling methods reduce motion artifacts by causing a signal produced by moving signal regions to rephase at the center of a data acquisition simultaneously with the rephasing of a signal produced by stationary signal regions. The rephasing of signals produced by moving and stationary signal regions is achieved by controlling gradient time/amplitude activity in each of the three orthogonal directions.

Motion artifact suppression techniques based on gradient moment nulling methods have proven to be an effective way to reduce motion artifacts and partially restore signal from moving tissues. MAST-based techniques have been successfully applied to a wide range of sequences. In spin echo imaging, the excitation pulse is followed by application of a refocusing pulse to induce a first echo.

However, the application of MAST techniques to fast spin echo (FSE) sequences has had drawbacks. In fast spin echo imaging, the echo is followed by another refocusing pulse to induce a second echo which is followed by a further refocusing pulse to induce a third echo, etc. The application of standard MAST techniques to FSE sequences produce less than complete motion compensation because the multiple refocusing pulses (anywhere from 2 to 256, or more refocusing pulses) produce a large number of signal pathways which experience different MAST gradient activity. The different signal pathways, with different MAST gradient activity history, constructively and destructively recombine during data readout, and produce ghosting artifacts. Modifications to the standard MAST technique have been suggested specifically for FSE sequences. The modified MAST technique attempts to synchronize the MAST gradient activity history such that there are fewer destructively interfering pathways.

Techniques which attempt to rephase additional signal pathways are better, but place even larger demands on the gradient subsystem, when compared to standard MAST methods. In general, gradient moment nulling techniques increase FSE interecho spacing, thereby reducing the image signal to noise ratio (SNR) and increasing motion artifacts compared to uncompensated FSE sequences. The SNR losses can be partially restored by increasing field of view (FOV) and slice thickness sequence minima, thereby reducing interecho spacing.

In addition, the intensive gradient activity required for gradient moment nulling may exceed amplifier limits and the gradient tube heat capacity limit for long ETL, multislice FSE sequences on some scanners, forcing additional sequence parameter compromises. The extra gradient activity also induces extra eddy currents which can degrade FSE image quality, even on self-shielded gradient systems.

It is known that for the general class of multiecho sequences, the even numbered echoes produce fewer motion related artifacts than the odd number echoes. Sequences have been designed which reduce the severity of motion-induced image artifacts by ordering the acquisition of k-space to take advantage of the even echo rephasing phenomenon.

U.S. Pat. No. 5,431,163 discloses a number of methods for reducing motion artifacts in FSE images. In one disclosed method, motion artifacts are reduced by ordering the collection of k-space to take advantage of the even echo refocusing phenomenon. In another disclosed method, all odd numbered echos are eliminated. However, eliminating all odd numbered echos disadvantageously doubles the required scan time. In a further disclosed method, odd numbered echo 1 is retained and odd numbered echoes 3 and 5 are eliminated. However, the data acquisition windows which produce the strongest artifact, in order, are 1, 3, . . . , etc. In other words, the odd numbered data acquisition windows, with the first data acquisition window producing the strongest artifact.

Accordingly, it has been considered desirable to develop a new and improved method for reducing fast spin echo motion artifacts by echo selection which meets the above-stated needs and overcomes the foregoing difficulties and others while providing better and more advantageous results.

SUMMARY OF THE INVENTION

In accordance with one aspect of the present invention, a magnetic resonance imaging system is provided. The magnetic resonance imaging system includes a magnet for generating a temporally and spatially constant magnetic field through an examination region. A transmitter excites dipoles in the examination region such that radio frequency resonance signals are generated. Gradient amplifiers and gradient magnetic field coils generate at least phase and read magnetic field gradient pulses along orthogonal axes across the examination region. A sequence controller controls the transmitter and the gradient amplifiers to cause excitation and following each excitation with a plurality of echoes for use in generating sets of views. A receiver receives and demodulates the radio frequency magnetic resonance signals read during the read gradients to produce the sets of views. A reconstruction processor reconstructs the sets of views into image representations. An image memory stores the image representations. The system further includes a receiver gating circuit connected to sequence controller for controlling the receiver to process even numbered echoes and process odd numbered echoes which occur after a threshold number of the plurality of echoes to generate the sets of views.

In accordance with another aspect of the present invention, a method of magnetic resonance imaging is disclosed. The method includes exciting dipoles within a selected imaging region to produce magnetic resonance signals, inducing a train of magnetic resonance echoes after each excitation, phase and frequency-encoding the train of magnetic resonance echoes, sampling at least the even echoes and the odd echoes that occur after a threshold number of echoes of the train, reconstructing an image representation from the even echoes and the odd echoes that occur after the threshold number of echoes of the train, and converting the image representation into a human-readable display.

One advantage of the present invention is the provision of method for reducing fast spin echo motion artifacts while maintaining interecho spacing the same as an uncompensated FSE sequence.

Another advantage of the present invention is that field of view, slice, and minimum echo time sequence selection parameters are identical to an uncompensated FSE sequence. Thus, the new sequence is not compromised like MAST techniques.

Yet another advantage of the present invention is that it reduces gradient demands compared to MAST techniques.

Still another advantage of the present invention is that it improves the signal to noise ratio compared to MAST sequences.

Still another advantage of the present invention resides in a reduction of eddy currents compared to MAST sequences.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
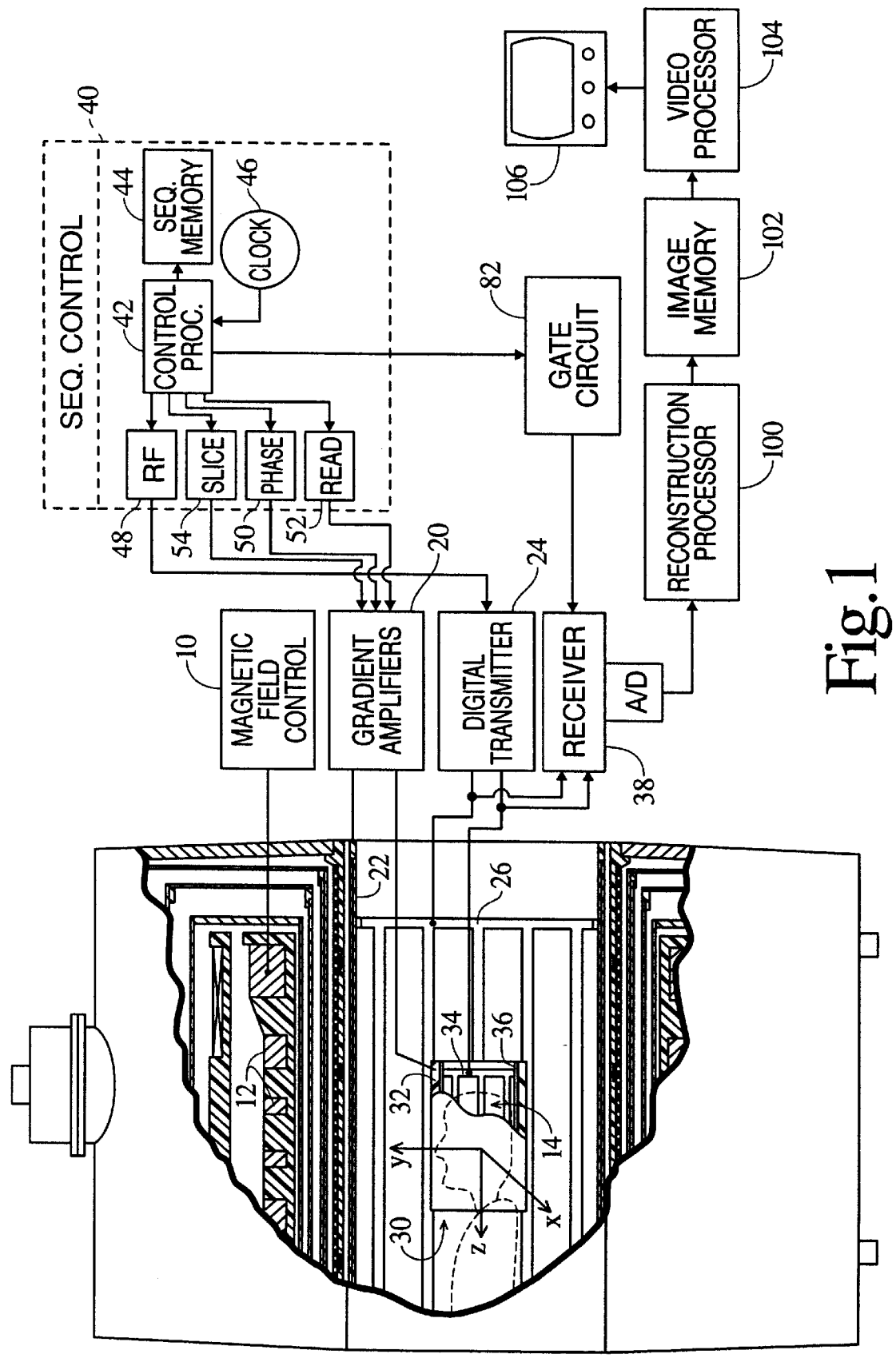
FIG. 1 is a diagrammatic illustration of a magnetic resonance imaging system in accordance with the present invention.

With reference to FIG. 1, a main magnetic field control 10 controls superconducting or resistive magnets 12 such that a substantially uniform, temporally constant magnetic field is created along the z-axis through an examination region 14. A magnetic resonance echo means applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectroscopy sequences.

More specifically, gradient amplifiers 20 apply current pulses to selected ones or pairs of whole body gradient coils 22 to create magnetic field gradients along x, y, and z-axes of the examination region 14. A digital radio frequency transmitter 24 transmits radio frequency pulses to a whole body RF coil 26 to transmit RF pulses into the examination region.

Each radio frequency pulse is typically composed of a packet of immediately contiguous pulse segments of short duration which, when taken together with any applied gradients, achieve a selected magnetic resonance manipulation, e.g., tip the magnetization by a selected angle such as 90°, 45°, a few degrees, the Ernst angle, or the like. The RF pulses are used to saturate, excite, invert magnetization, refocus, or manipulate magnetization in selected portions of the examination region. For whole body applications, the signals are commonly picked up by the whole body RF coil 26.

For generating images of limited regions of the subject, local coils are commonly placed adjacent to the selected region. For example, an insertable head coil 30 is inserted with a selected brain region at the isocenter of the bore. The insertable head coil preferably includes local gradient coils 32 which receive current pulses from the gradient amplifiers 20 to create magnetic field gradients along x, y, and z-axes in the examination region within the head coil. A local radio frequency coil 34 is used to excite magnetic resonance and receive magnetic resonance signals emanating from the patient's head.

Alternatively, a receive-only local radio frequency coil can be used to receive resonance signals induced by body-coil RF transmissions. An RF screen 36 blocks the RF signals from the RF head coil from inducing eddy currents in the gradient coils and the surrounding structures. The resultant radio frequency signals are picked-up by the whole body RF coil 26, the local RF coil 34, or other specialized RF coils and demodulated by a receiver 38, preferably a digital receiver.

A sequence control processor 40 controls the gradient amplifiers 20 and the transmitter 24 to perform any one of a plurality of imaging sequences such as fast spin echo (FSE), echo planar (EPI), echo volume (EVI), gradient and spin echo (SE) and the like. In the preferred fast spin echo embodiment, a control processor 42 retrieves a particular fast spin echo sequence (described further below) from a sequence memory 44. The processor is clocked by a clock or timing control 46 to control a radio frequency pulse circuit 48 which causes excitation, inversion, and other radio frequency pulses at appropriate times in the imaging sequence.

The control processor 42 also controls a phase-encode gradient circuit 50 which forms phase-encode gradient pulses of selected amplitudes at the appropriate times in each repetition. The control processor further controls a read gradient circuit 52 which controls the formation of read gradients at appropriate points in the FSE imaging sequence to read out the induced spin echoes or, in gradient echo embodiments, to induce and read out gradient echoes.

A third dimension encoding circuit 54 causes the generation of slice select gradients or frequency-encoding gradients along a third axis orthogonal to the axis of the phase-encode gradients from the phase-encode gradient circuit 50 and orthogonal to the axis of the read gradients.

Figure 2:
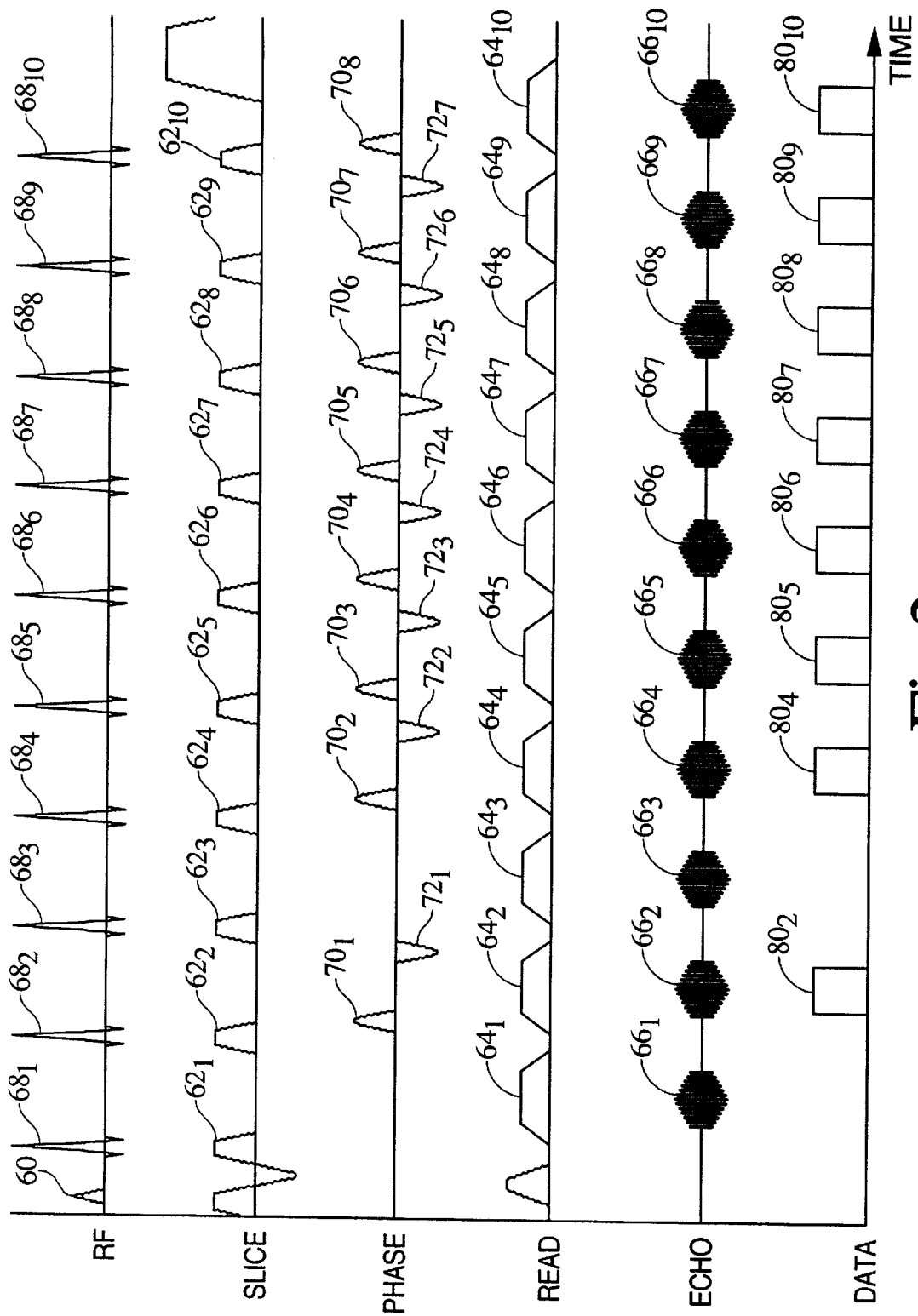
FIG. 2 is a diagrammatic illustration of a fast spin echo imaging sequence in accordance with the present invention.

With reference to FIG. 2, the sequence control processor 40 controls the gradient amplifiers 20 and the transmitter 24 to perform a preferred FSE imaging sequence. In particular, the radio frequency pulse circuit 48 first causes the transmitter 24 to generate a radio frequency excitation pulse 60, e.g., a tailored 90° RF pulse, although lower tip angles are also contemplated. The third dimension encoding circuit 54 and the gradient amplifiers 20 cause the application of a slice select gradient $62_1$, $62_2$, . . . , in the illustrated embodiment, which limits the excitation by RF pulse 60 and refocusing pulses $68_1$–$68_n$ to a single selected slice.

The read gradient circuit 52 and the gradient amplifiers 20 cause the application of a read gradient $64_1$, $64_2$, . . . , concurrently with each induced magnetic resonance echo $66_1$, $66_2$, . . . More specifically to the fast spin echo sequence, following the radio frequency excitation pulse 60, the radio frequency circuit 48 and transmitter 24 generate a radio frequency refocusing pulse $68_1$, which causes a refocusing of the magnetization into the echo $66_1$. The center of the echo is at an echo time (TE) after the radio frequency excitation 60. That is, the center of the echo occurs the same time duration after the refocusing pulse as the time duration by which the refocusing pulse followed the excitation pulse.

The first or first odd echo $66_1$, is not sampled or received by the receiver 38. A further refocusing pulse $68_2$ is applied after the first echo $66_1$. The further refocusing pulse $68_2$ causes a further refocusing of the magnetization causing a second echo $66_2$ which is phase-encoded by a phase-encode gradient generated by the phase-encode circuit 50. In particular, the phase-encode circuit 50 causes the application of a phase-encode gradient $70_1$, following the refocusing pulse $68_2$, and a rewind phase-encode gradient $72_1$ of equal and opposite magnitude to remove the phase-encoding after each data collection interval.

The second echo $66_2$ follows the second refocusing pulse $68_2$ by a time duration which is equal to the time duration between the center of the first echo $66_1$ and the second refocusing pulse $68_2$. The effective echo time of the second echo $66_2$ is the time duration between the excitation pulse 60 and the center of the second echo $66_2$. Upon application of a read gradient $64_2$, the second, or more particularly, first even echo $66_2$ is then sampled or received as data by the receiver 38.

A further refocusing pulse $68_3$ is applied after the second echo $66_2$. The further refocusing pulse $68_3$ causes a further refocusing of the magnetization causing a third, or more particularly, a second odd echo $66_3$. As with the first odd echo $66_1$, the second odd echo $66_3$ is not sampled or received by the receiver 38. Instead, a further refocusing pulse $68_4$ is applied after the second odd echo $66_3$. The further refocusing pulse $68_4$ causes a further refocusing of the magnetization causing a second even echo $66_4$ which is phase-encoded by the application of a phase-encode gradient $70_2$ following the refocusing pulse $68_4$, and a rewind phase-encode gradient $72_2$ of equal and opposite magnitude to remove the phase-encoding after the data collection interval. Upon application of a read gradient $64_4$, the second even echo $66_4$ is then sampled or received as data by the receiver 38.

The radio frequency pulse circuit 48 and the digital transmitter 24 may continue to cause the application of radio frequency refocusing pulses $68_5$ $68_6$, . . . The third dimension encoding circuit 54 and the gradient amplifiers 20 continue to cause the application of slice select gradients $62_5$, $62_6$, . . . , which continue to limit the excitation by RF pulse 60 and refocusing pulses $68_1$–$68_n$, to the single slice. The phase-encode circuit 50 and the gradient amplifiers 20 continue to cause the application of the phase-encode gradients $70_3$, $70_4$, . . . , following each refocusing pulse, and rewind phase-encode gradients $72_3$, $72_4$, . . . , of equal and opposite magnitude to remove the phase-encoding after each data collection interval. The read gradient circuit 52 and the gradient amplifiers 20 continue to cause the application of the read gradients $64_5$, $64_6$, . . . , concurrently with each induced magnetic resonance echo $66_5$, $66_6$, . . . The echoes $66_5$, $66_6$, . . . , are then sampled or received as data by the receiver 38. In the various repetitions, the phase-encode gradients are stepped such that the echoes generate data lines with each of a plurality of phase-encodings.

Thus, in the above-described FSE sequence, the echo train has ten echoes $66_1$–$66_{10}$, eight of which (e.g. echoes $66_2$ and $66_4$–$66_{10}$) are sampled by the receiver 38. Thus, the collection of k-space is divided into eight positive k-space segments above the zero or central phase-encoded data line and eight negative k-space segments below the zero or central phase-encoded data line. It should be appreciated that the FSE sequence can be applied to any data acquisition trajectory through k-space.

It should be appreciated that in a multi-slice embodiment, one or more additional repetitions of the above-described FSE sequence are utilized, i.e., a second RF pulse is applied in the presence of a second slice select gradient to excite resonance in another slice of the imaged volume, and multiple refocusing pulses are applied to induce spin echoes which are read out in the presence of read gradients.

With continuing reference to FIG. 2 and reference again to FIG. 1, the sequence memory 44 causes the control processor to send a series of receiver gating pulses $80_2$, $80_4$, $80_5$, $80_6$, . . . , $80_{10}$. Again, the gating pulses enable the even echoes and the odd echoes above the third echo to be received, demodulated and processed. It should be appreciated that the first echo $66_1$ and third echo $66_3$ do form in response to the refocusing pulses $68_1$ and $68_3$. However, a gating circuit 82 prevents at least the first and third echo signals from being demodulated and processed. In the illustrated embodiment, the gating circuit 82 enables the receiver 38 during the even echoes and the odd echoes above a threshold, e.g., above the third echo and disables the receiver at and below the threshold, e.g., during the first and third echoes. Alternatively, the first and third echo signals can be demodulated by the receiver and discarded, or used for other purposes.

An image reconstruction processor 100 then reconstructs the data set excluding at least the first and third echo signals (or other selected odd echoes) from the receiver 38 into an image representation that is stored in an image memory 102. It should be appreciated that the gating circuit 82 may prevent the reconstruction processor 100 from using at least the first and third echoes to reconstruct the data into the resulting image representation. A video processor 104 converts selected slices, three-dimensional renderings, and other portions of the data in the image memory into an appropriate format for display on a human-readable monitor 106.

Thus, fast spin echo motion artifacts are reduced by eliminating the data acquisitions (e.g. the first and third echoes $66_1$, $66_3$) which dominate the motion artifact. This technique reduces motion sensitivity while retaining the same interecho spacing of an uncompensated FSE sequence. The FSE sequence does not actively restore signal from moving tissues, other than the even echo rephrasing phenomenon which all FSE sequences demonstrate to some degree.

In particular, the above-described FSE sequence reduces motion artifacts by bypassing those echoes which include the dominant motion artifact terms. It should be appreciated that the severity of a motion artifact decreases with increasing echo number and decreased interecho spacing, and that the most significant component of the motion artifact occurs in the first and third echoes. While rejecting the first and third echoes does not completely eliminate the image artifact, it does reduce the severity of the artifact.

The FSE sequence suffers a small SNR penalty because the total echo train length (ETL) time is increased by the number of echoes discarded (e.g., 2). Consequently, for the shortest ETL FSE sequences, the SNR loss and increased scan time of the new sequence may slightly exceed FSE sequences which use gradient nulling motion artifact reduction techniques.

The reduced gradient activity associated with the FSE sequence produces fewer eddy currents compared with the gradient moment nulled FSE sequences. While the eddy currents produced by modern self shielded gradients are very small, eddy currents can still reduce FSE image quality. However, eddy currents are a significant issue for unshielded gradient systems.

The present FSE sequence reduces motion artifacts by not sampling the echoes which produce the dominant motion artifact terms in the image. The FSE sequence does not reduce motion artifacts in all cases to the same degree as gradient moment nulled FSE sequences, but the FSE sequence places fewer demands on the gradient system, produces fewer eddy currents, and can produce images with shorter interecho spacing, better SNR, smaller FOV and thinner slices compared with MAST techniques.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

For instance, the application of standard or FSE specific MAST techniques to selected data acquisition windows is contemplated. In addition, methods which reduce the dead time introduced by removing various data acquisition windows which are compatible with the Carr-Purcell-Meiboom-Gill class of sequences, to which FSE belongs, is also contemplated. Further, discarding one or more of the even echoes is contemplated in order to reduce the severity of artifacts.

Having thus described the preferred embodiment, the invention is now claimed to be:

1. A magnetic resonance imaging system which includes a magnet for generating a temporally constant magnetic field through an examination region, a transmitter for exciting dipoles in the examination region such that radio frequency resonance signals are generated, gradient amplifiers and gradient magnetic field coils for generating at least phase and read magnetic field gradient pulses along orthogonal axes across the examination region, a sequence controller for controlling the transmitter and the gradient amplifiers to cause excitation and following each excitation with a plurality of echoes for use in generating sets of views, a receiver for receiving and demodulating the radio frequency magnetic resonance signals read during the read gradients to produce the sets of views, a reconstruction processor for reconstructing the sets of views into image representations, and an image memory for storing the image representations, the system further comprising:

a receiver gating circuit connected to the sequence controller for controlling the receiver to process even numbered echoes and process odd numbered echoes which occur after a threshold number of the plurality of echoes to generate the sets of views.

2. The magnetic resonance imaging system as set forth in claim 1, wherein said threshold number of the plurality of echoes is three.

3. The magnetic resonance imaging system as set forth in claim 1 wherein at least a second echo and a fourth echo are processed, and at least a first echo and a third echo are not processed in order to generate the sets of views.

4. The magnetic resonance imaging system as set forth in claim 1 wherein the sequence controller causes the transmitter to apply a series of radio frequency inversion pulses to induce the plurality of echoes.

5. A method of magnetic resonance imaging comprising:
a) exciting dipoles within a selected imaging region to produce magnetic resonance signals;
b) inducing a train of magnetic resonance echoes after each excitation;
c) phase and frequency-encoding the train of magnetic resonance echoes;
d) sampling at least the even echoes and the odd echoes that occur after a threshold number of echoes of the train;
e) reconstructing an image representation from the even echoes and the odd echoes that occur after the threshold number of echoes of the train; and
f) converting the image representation into a human-readable display.

6. The method as set forth in claim 5, wherein the sampling step includes:
g) sampling at least some of the even echoes and at least some of the odd echoes that occur after the third echo of the train of magnetic resonance echoes.

7. The method as set forth in claim 5 wherein the threshold is the third echo, such that the image representation is reconstructed without data from the first and third echoes and with data from at least the second echo and the fourth echo.

8. The method as set forth in claim 3 further including:
h) applying a radio frequency refocusing pulse to induce each echo of the train of magnetic resonance echoes.

* * * * *